United States Patent [19]

Matsunaga

[11] Patent Number: 5,490,268
[45] Date of Patent: Feb. 6, 1996

[54] METHOD FOR CHANGING AN ARRANGEMENT OF AN INITIAL COMBINATIONAL CIRCUIT TO SATISFY PRESCRIBED DELAY TIME BY COMPUTING PERMISSIBLE FUNCTIONS OF OUTPUT GATES AND REMAINING GATES

[75] Inventor: Yusuke Matsunaga, Yokohama, Japan

[73] Assignee: Fujitsu Limited, Kanagawa, Japan

[21] Appl. No.: 666,741

[22] Filed: Mar. 8, 1991

[30] Foreign Application Priority Data

Mar. 9, 1990 [JP] Japan ............................... 2-59071

[51] Int. Cl.$^6$ .................................................. G06F 1/04
[52] U.S. Cl. ...................... 395/550; 371/22.1; 371/22.3; 364/488; 364/489; 364/490; 364/DIG. 1; 395/800
[58] Field of Search .................. 371/11.1, 11.3, 371/26, 22.1, 22.3, 22.5, 22.6, 62; 395/550, 275, 800; 364/927.8, 947.1, 951.3, 229.4, 565, 488, 489, 490, 491

[56] References Cited

U.S. PATENT DOCUMENTS

| | | | |
|---|---|---|---|
| 4,263,651 | 4/1981 | Donath et al. | 364/491 |
| 4,698,760 | 10/1987 | Lembach et al. | 364/488 |
| 4,876,501 | 10/1989 | Ardini et al. | 371/62 |
| 4,916,627 | 4/1990 | Hathaway | 364/489 |
| 4,940,908 | 7/1990 | Tran | 364/488 |
| 4,954,953 | 9/1990 | Bush | 364/489 |
| 4,972,412 | 11/1990 | Satoh | 371/62 |
| 5,043,986 | 8/1991 | Agrawal et al. | 371/22.6 |
| 5,095,454 | 3/1992 | Huang | 364/488 |

OTHER PUBLICATIONS

"Multi–level Logic Optimization Using Binary Decision Diagrams" (Proceedings of the IEEE International Conference on Computer–Aided Design–Nov. 5–9, 1989 CA).

"Timing Optimization for Multi–Level Combinational Networks" (27th ACM/IEEE Design Automation Conference, Jun., 1990).

"the Transduction Method–Design of Logic Networks Based on Permissible Functions" (IEEE Transactions of Computers, vol. 38, No. 10, Oct., 1989).

Primary Examiner—Thomas C. Lee
Assistant Examiner—Moustafa M. Meky
Attorney, Agent, or Firm—Staas & Halsey

[57] ABSTRACT

A method of automatically forming a combinational LSI circuit comprising two processes. A first process of computing the permissible function of each element (gate) of a given circuit. A second process of connecting a gate having a shorter signal propagation time to a gate located on a path that does not satisfy a prescribed delay time and removing the gate from the path. Thus, an arrangement of the circuit is changed and the maximum delay time of the circuit is suppressed below the prescribed delay time. This method efficiently shortens the delay time of the combinational circuit to satisfy the prescribed delay time.

4 Claims, 10 Drawing Sheets

| a b c | d e f g h | PERMISSIBLE FUNCTION OF h |
|---|---|---|
| 0 0 0 | 0 0 1 1 0 | 0 |
| 0 0 1 | 1 1 1 0 0 | 0 |
| 0 1 0 | 0 0 0 1 0 | 0 |
| 0 1 1 | 0 0 1 1 0 | * |
| 1 0 0 | 1 0 1 1 1 | * |
| 1 0 1 | 1 1 1 0 0 | 0 |
| 1 1 0 | 1 0 0 1 0 | 0 |
| 1 1 1 | 1 0 1 1 1 | 1 |

METHOD FOR CHANGING AN ARRANGEMENT OF AN INITIAL COMBINATIONAL CIRCUIT TO SATISFY PRESCRIBED DELAY TIME BY COMPUTING PERMISSIBLE FUNCTIONS OF OUTPUT GATES AND REMAINING GATES

BACKGROUND OF THE INVENTION

1. Field of the Invention

The present invention relates to a method of automatically forming a combinational circuit of a large scale integration (LSI) type by use of a computer and particularly, to a method which employs a permissible function of a circuit to change an arrangement of the combinational circuit to improve operational speed of the circuit.

2. Description of the Related Art

It is presently possible to automatically form a combinational LSI circuit using a computer. Compared with a circuit designed by a skilled engineer, however, the automatically formed circuit is usually inferior in terms of the excessive number of gates, low operational speed, etc.

These matters, therefore, must be considered in designing and automatically forming the combinational circuit, or the automatically formed circuit may need to be subjected to a delay time shortening process to satisfy such design requirements.

Figure 1:
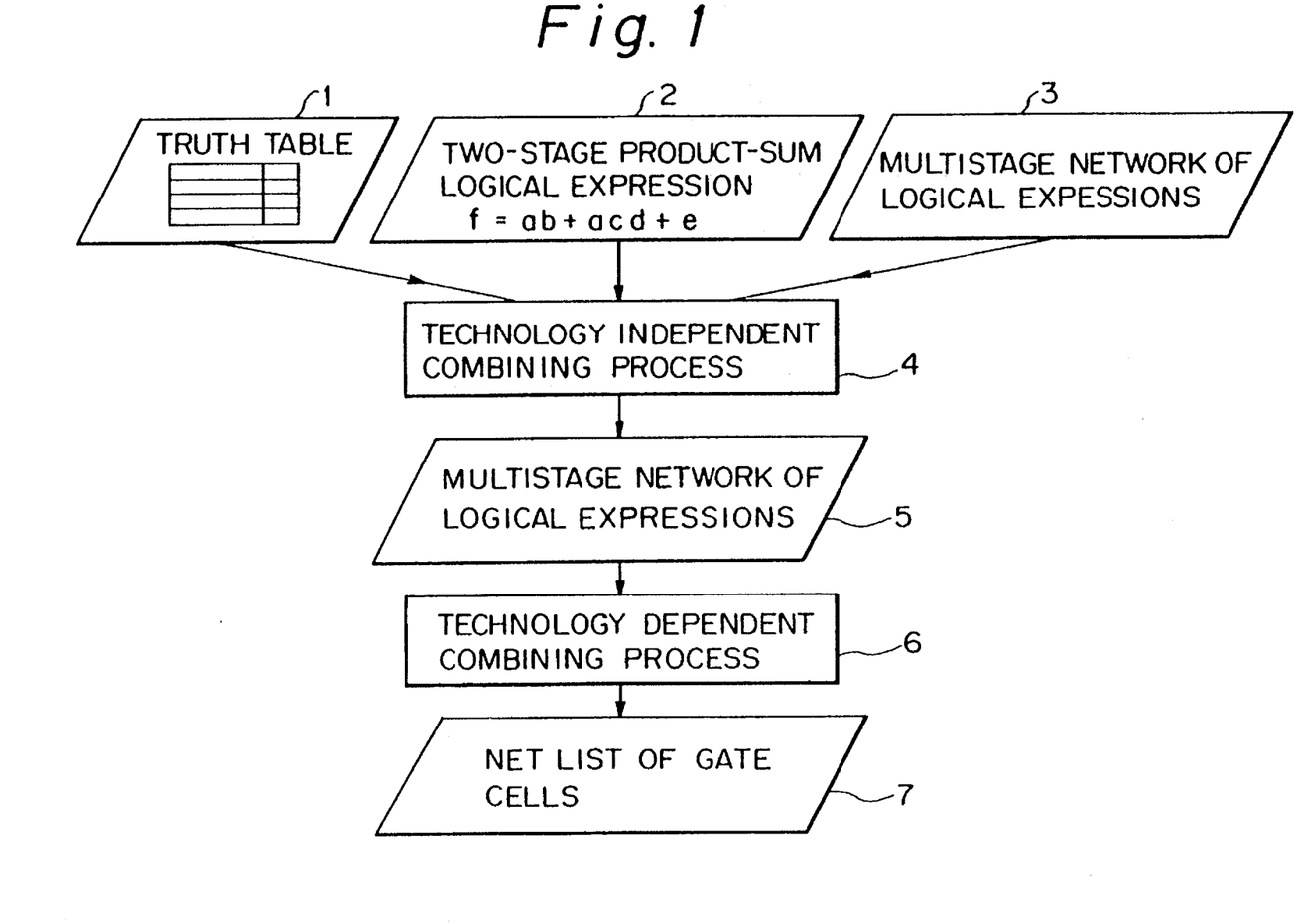
FIG. 1 is a flowchart showing a standard flow of a logical combination process related to the invention.
Figure 2A:
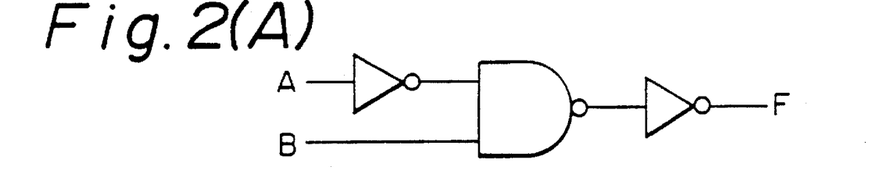
FIGS. 2(A) and 2(B) are diagrams explaining a basic idea of circuit conversion according to a prior art.
Figure 2B:
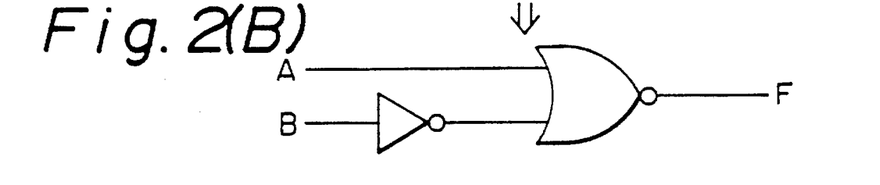

FIG. 1 shows a standard process of combining an LSI circuit for which the present invention is applicable, and FIG. 2(A) and 2(B) explains an example of forming a combinational circuit according to a prior art. The prior art employs a computer and automatically forms the LSI combinational circuit according to the flow of FIG. 1.

In FIG. 1, a truth table 1, a two-stage product-sum logical expression 2, or a multistage network 3 of logical expressions is provided, and a technology independent combining process 4 is carried out. The term "technology independent" means that the process is done purely logically with no consideration of hardware technology such as the types of transistors and the structure of logic elements. The combining process 4 produces a multistage network of logical expressions 5, according to which a technology dependent combining process 6 is carried out to prepare a net list of gate cells indicating a connection of inputs and outputs of all cells of the circuit. According to this net list, an actual LSI is prepared.

The automatic combining process mainly comprises a multistage process of converting two-stage logical expressions into multistage logical expressions, and a technology mapping process of assigning actual circuit elements to each the multistage logical expressions, respectively. For each of the processes (assigned circuit elements), a delay time must be considered.

The multistage process sets the maximum number of stages which must not be surpassed. The maximum number of stages roughly specifies the delay time of the circuit but does not always correspond to the delay time of an actually formed circuit, so that the adjustment of the delay time cannot precisely be done based on the number of stages.

The technology mapping process uses conversion patterns or circuit equivalencies to shorten a delay time. For example, as shown in FIG. 2(A) and 2(B) a conversion pattern or equivalence circuit for the circuit of FIG 2(A) is the circuit in FIG. 2(b) whose input and output are equivalent to those of the circuit in FIG. 2(A). To shorten a delay time between a terminal A and a terminal F of the circuit of FIG. 2(A), the circuit is converted into the circuit of FIG. 2(B). This sort of conversion can precisely adjust the delay time of an actually formed circuit.

A drawback of this technique is that the conversion is always done according to predetermined conversion patterns with no exceptions. To realize a superior circuit, it is necessary to increase the kinds of conversion patterns. However, this increases the time necessary for retrieving a conversion pattern suitable for a circuit to be optimized, so that, in actual operation, the number of the conversion patterns that can be stored is time limited because of the searching process. For the same reason, the size of each conversion pattern is limited to several gates. This technique is, therefore, almost useless for a circuit whose delay time will be improved only when the entire circuit is converted into another configuration.

To solve the above problem, another prior art wholly converts the structure of a circuit according to the multistage process, and precisely adjusts the circuit according to the technology mapping process.

The efficiency of this technique is, however, is very poor because two different processes must be repeated. In addition, the two processes are not always done in harmony with each other so that they may not always effectively shorten the delay time. It is necessary, therefore, to provide a delay time shortening process that takes the delay time of an actual circuit into consideration and wholly changes the structure of the circuit.

SUMMARY OF THE INVENTION

An object of the invention is to provide a method of automatically forming an LSI combinational circuit, which can solve the above problems and efficiently shorten the delay time of an automatically formed circuit to satisfy a prescribed delay time.

To achieve the object, a method of automatically forming an LSI combinational circuit according to the invention comprises a first process of computing permissible functions that must be observed by circuit elements (gates) of a given circuit, and a second process of finding, according to the permissible functions, paths that do not satisfy a prescribed delay time, and removing gates from or adding gates to each of the paths to keep the prescribed delay time.

DESCRIPTION OF THE PREFERRED EMBODIMENTS

Figure 3:
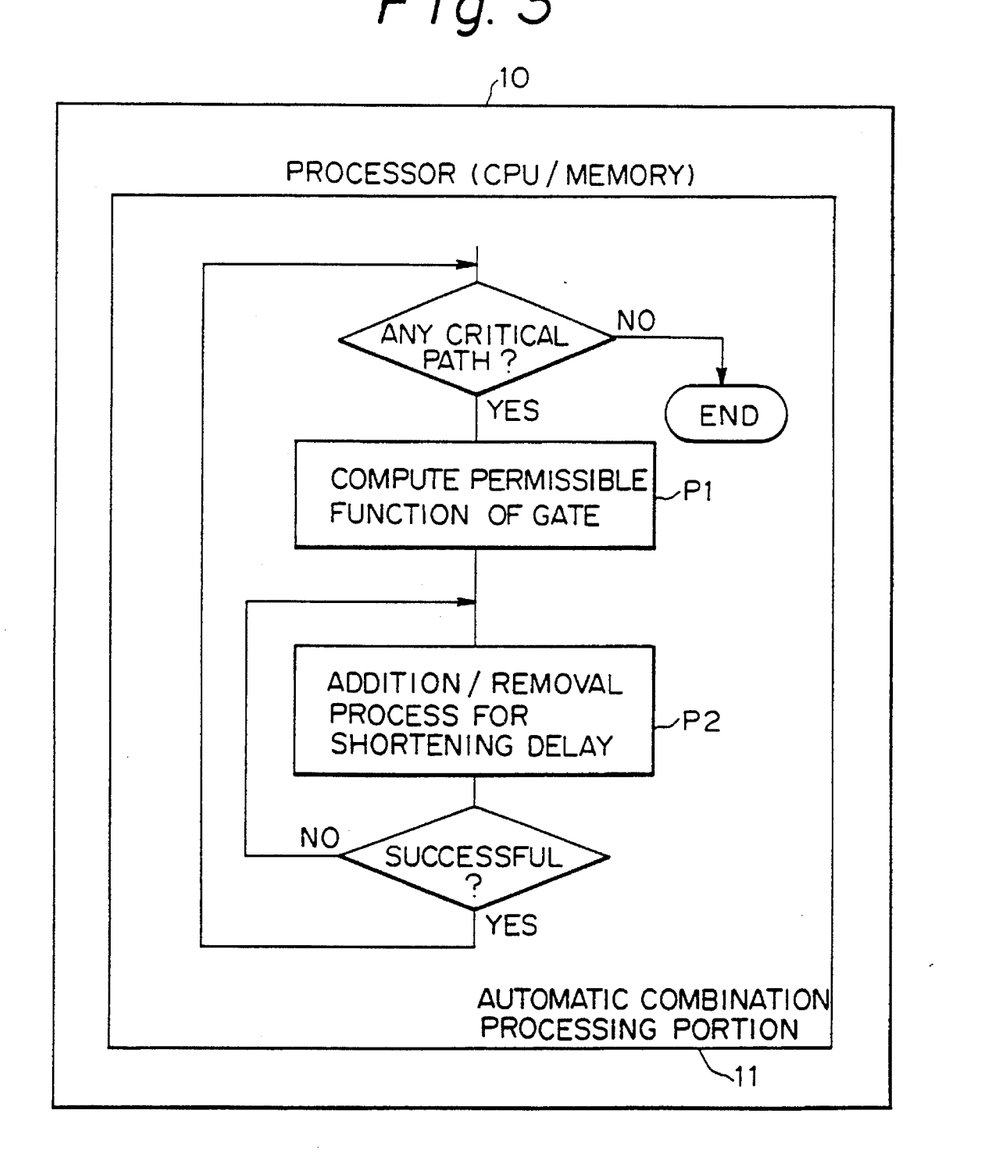
FIG. 3 is a diagram explaining a principle of the invention.

FIG. 3 shows a principle of the invention. A processor 10 comprises a CPU and memories. An automatic combination processing routine or portion 11 automatically forms a combinational circuit of an LSI type. The method of the invention comprises a first process P1 and a second process P2. The invention is mainly applied to the technology mapping process of the automatic combining process.

The automatic combination processing portion 11 shortens the delay time of a combined circuit. The operation of this portion 11 will now be explained.

If a given circuit involves a critical gate that violates a delay time prescribed for the circuit, the first process P1 computes a permissible function to be observed or performed by each circuit element (gate) of the circuit. Here, a gate is judged or determined to be critical if a signal propagation time through a path from an external input to an output of the gate is longer than the prescribed delay time. If this sort of critical gate exists, the path involving the critical gate cannot keep the prescribed delay time. An excessive delay time measured at the critical gate may be caused by the critical gate itself or by other gates existing on the same path.

According to the permissible functions, the second process P2 carries out an addition/removal process which is one of the features of the invention, on gates of the path that is violating the prescribed delay time, thereby shortening the delay time of the path. Without changing the permissible functions, the addition/removal process of the second process P2 adds other gates which have a faster signal propagation speed than that of the critical gate to the next gate whose input is connected to the output of the critical gate, and removes gates (including the critical gate) having a slow signal propagation speed from the path, thereby changing the configuration of the circuit. Alternatively, other gates are not added but only the gates having a slow signal propagation speed are removed from the path to change the circuit configuration. This process is repeated until the maximum delay time of the circuit is reduced below the prescribed delay time.

The invention computes the permissible function of each element of a given circuit and changes the configuration of the circuit according to the permissible functions.

Using the permissible functions to change the configuration of a circuit is conventional in reducing an area of the circuit but not so in improving the delay time of a circuit. The present invention employs the permissible functions for improving the delay time of a circuit.

The permissible function is a logical function that defines a range or group of equivalent operations in which the logic of an output of a circuit does not change. When a logic value is transmitted to the output of the circuit, the permissible function takes the actual logical value, and when it is not transmitted to the output, the permissible function takes a value of "don't care" represented by a mark "*" which may be either 0 or 1.

Figure 4:
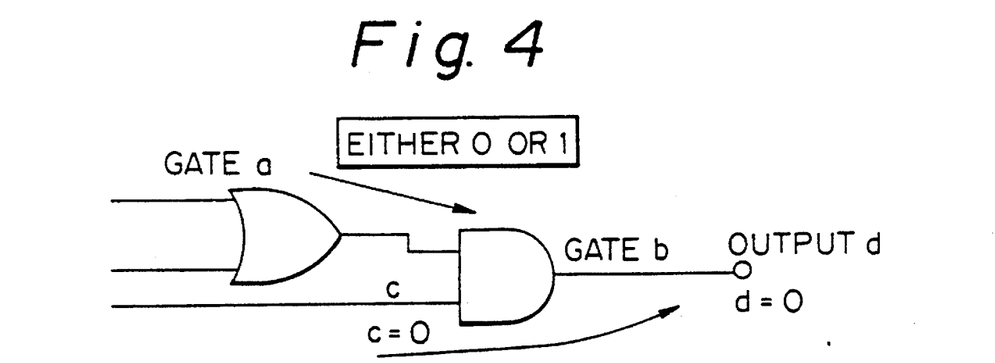
FIG. 4 is a view showing an example of a permissible function.

FIG. 4 shows an example of the permissible function. In the figure, an output of gate a is connected to an input of an AND gate b, so that a logical value of the gate a is not transmitted to an output d when another input c of the gate b takes a logical value of 0. In this case, a permissible function of the gate a is * when C=0. When the input c has a value of 1, the value of the gate a is transmitted to the output d, so that the permissible function is equal to the actual logical value of the gate a.

The present invention employs such permissible functions to change a circuit arrangement and shorten the delay time of the circuit. In more detail, the invention detects and lists paths violating a prescribed delay time among paths from an input terminal to an output terminal of a given circuit. On the listed paths (to be called the critical paths), each critical gate whose delay time exceeds the prescribed delay time is selected. To this critical gate, an output of a gate which has a faster signal propagation speed is newly added, and outputs of gates which have a slower signal propagation speed are removed, thereby shortening a signal propagation time of the critical path.

Figure 5:
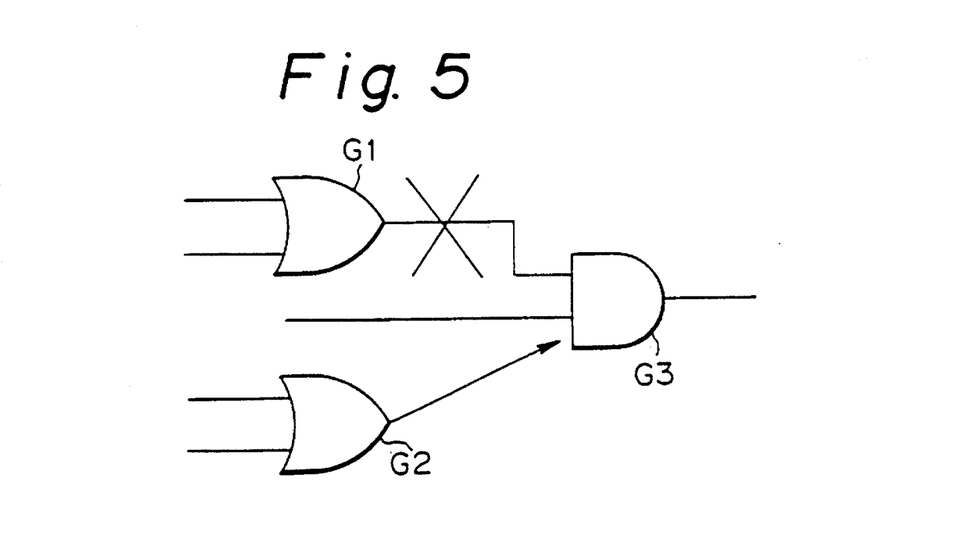
FIG. 5 is a diagram explaining a principle of a delay time shortening process.

FIG. 5 shows a principle of the delay time shortening process. In the figure, a gate G1 is a critical gate existing on a critical path. An output of the critical gate G1 is supplied to the next gate G3. Namely, the gate G1 is an input source of the gate G3. To the gate G3, a gate G2 having a short signal propagation time is added, and the gate G1 having the long signal propagation time is removed from the input of the gate G3. That is, a gate G2, which is faster than the gate G1 but has the same function, is substituted for the gate G1.

Such an addition of the new gate and a removal of the existing gate cannot be done freely but must be done carefully so as not to change a logical function of the circuit. To secure equality of the function, the permissible functions are employed.

It is assumed that adding a new input to a gate changes a logic of the gate from F to F'. If the logic F' is included in a permissible function and must be kept or maintained by the gate, it is secured, according to the definition of the permissible function, so that the converted circuit is logically equivalent to the previous circuit. This idea of equivalence is also applicable to the removal of inputs.

In this way, according to and by using the permissible functions, it is possible to secure logical equivalence and change a circuit without using conversion patterns.

Figure 6:
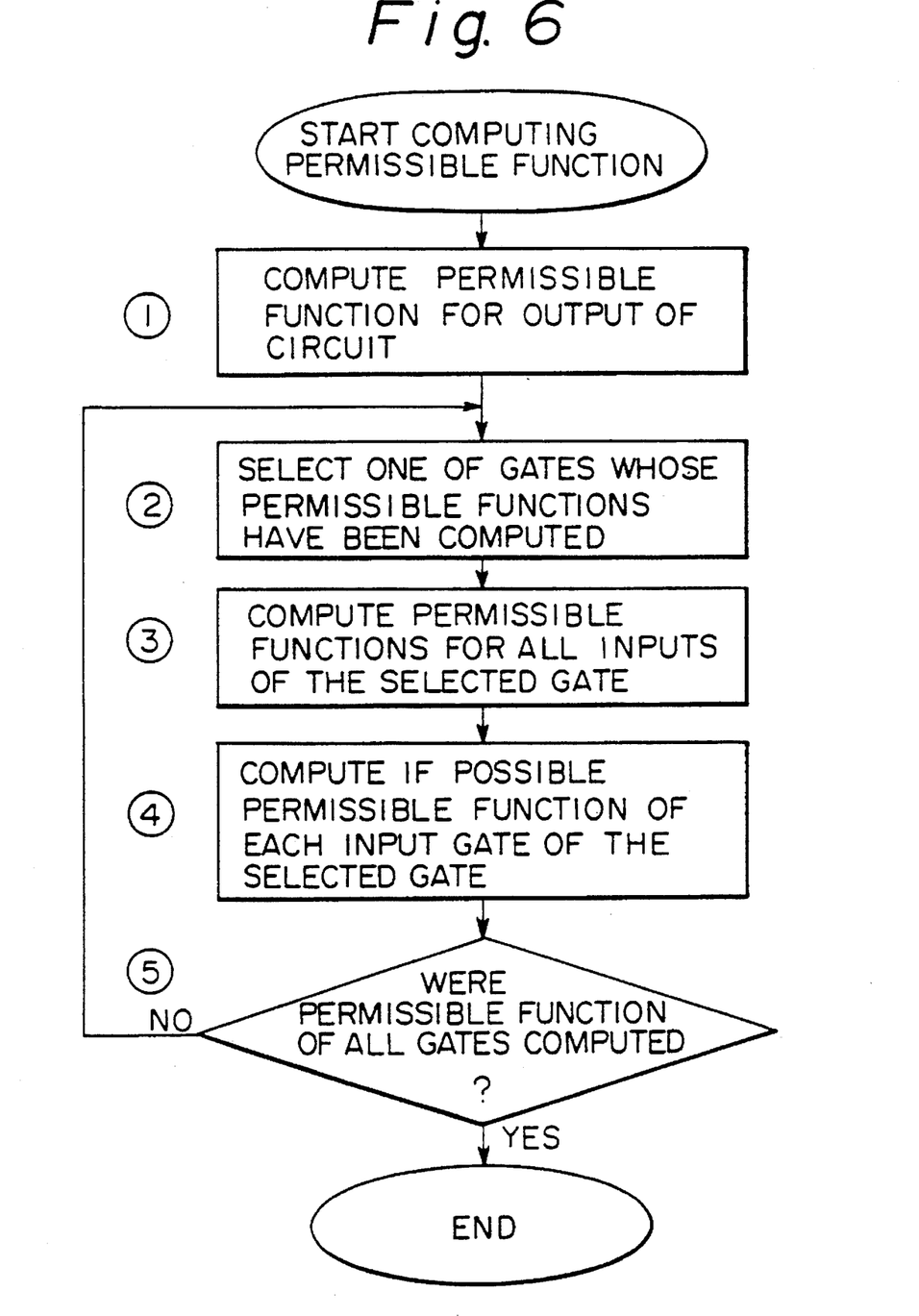
FIG. 6 is a flowchart showing a permissible function computing process according to an embodiment of the invention.
Figure 7:
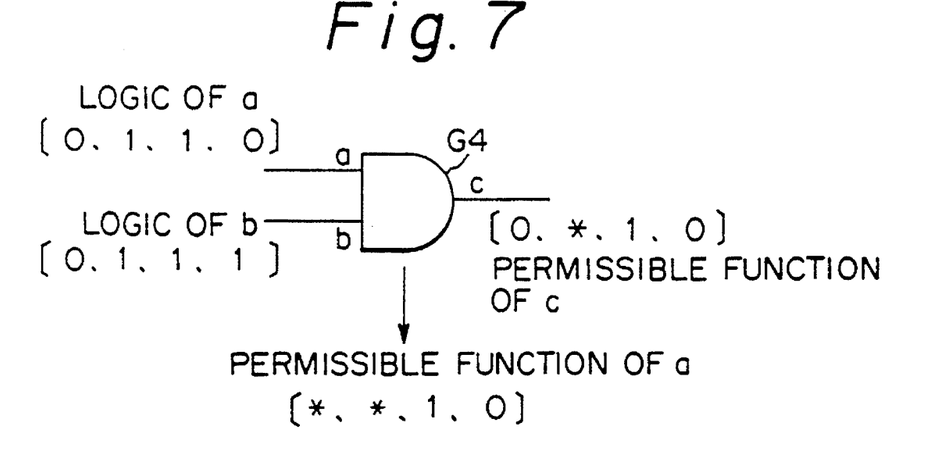
FIG. 7 is a diagram showing an example of computation of a permissible function for an input of a gate according to the embodiment.
Figure 8:
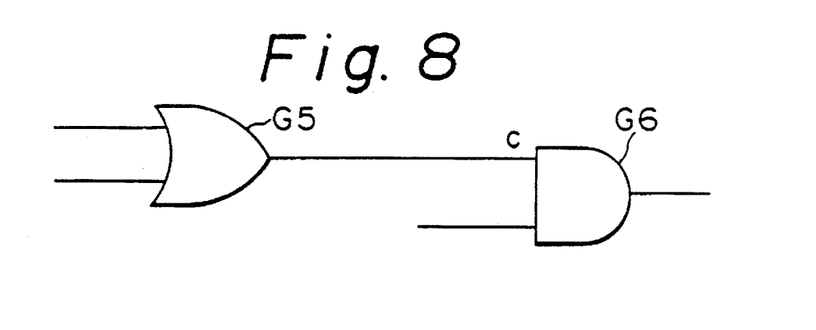
FIG. 8 is a diagram showing an example of a gate whose output is connected to only one gate, according to the embodiment.
Figure 9:
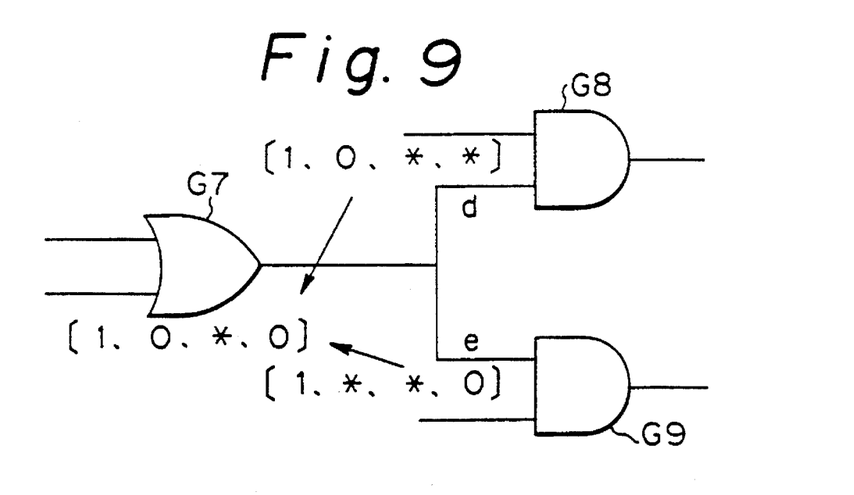
FIG. 9 is a diagram showing an example of computation of a permissible function of a gate whose output is connected to a plurality of gates, according to the embodiment.
Figure 10A:
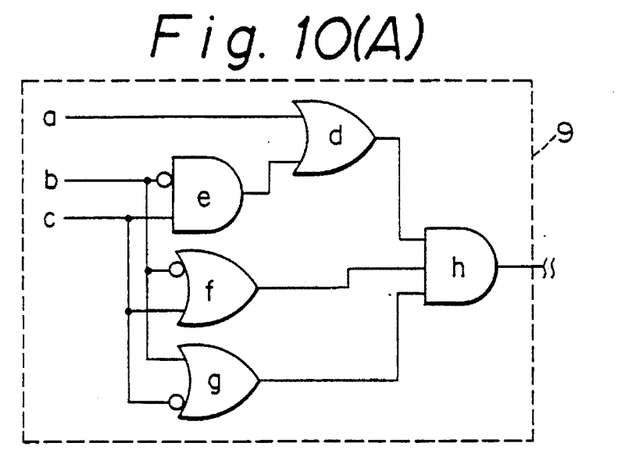
FIGS. 10(A), 10(B), 10(C) and 10(D) are diagrams showing an example of circuit conversion to be done according to permissible functions, according to the embodiment.
Figure 10B:
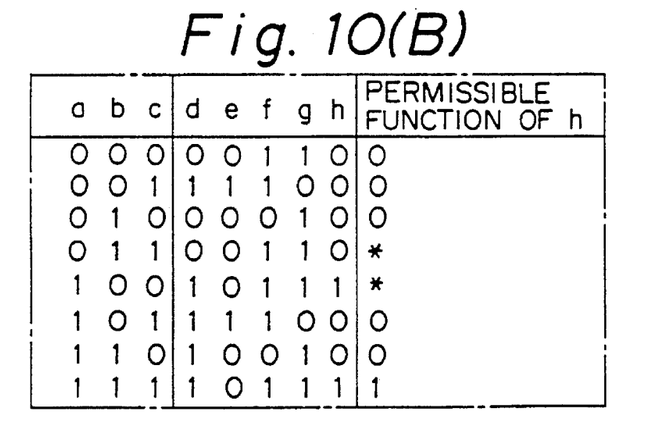
Figure 10C:
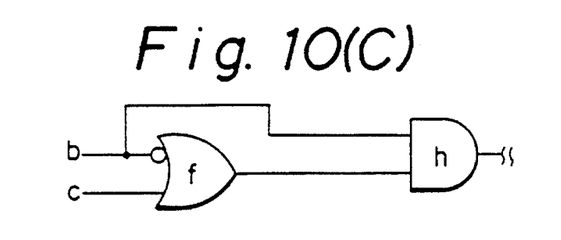
Figure 10D:
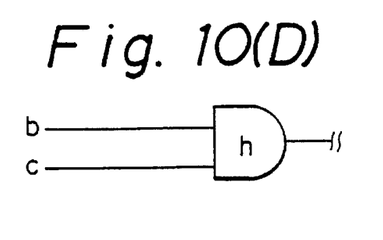
Figure 11:
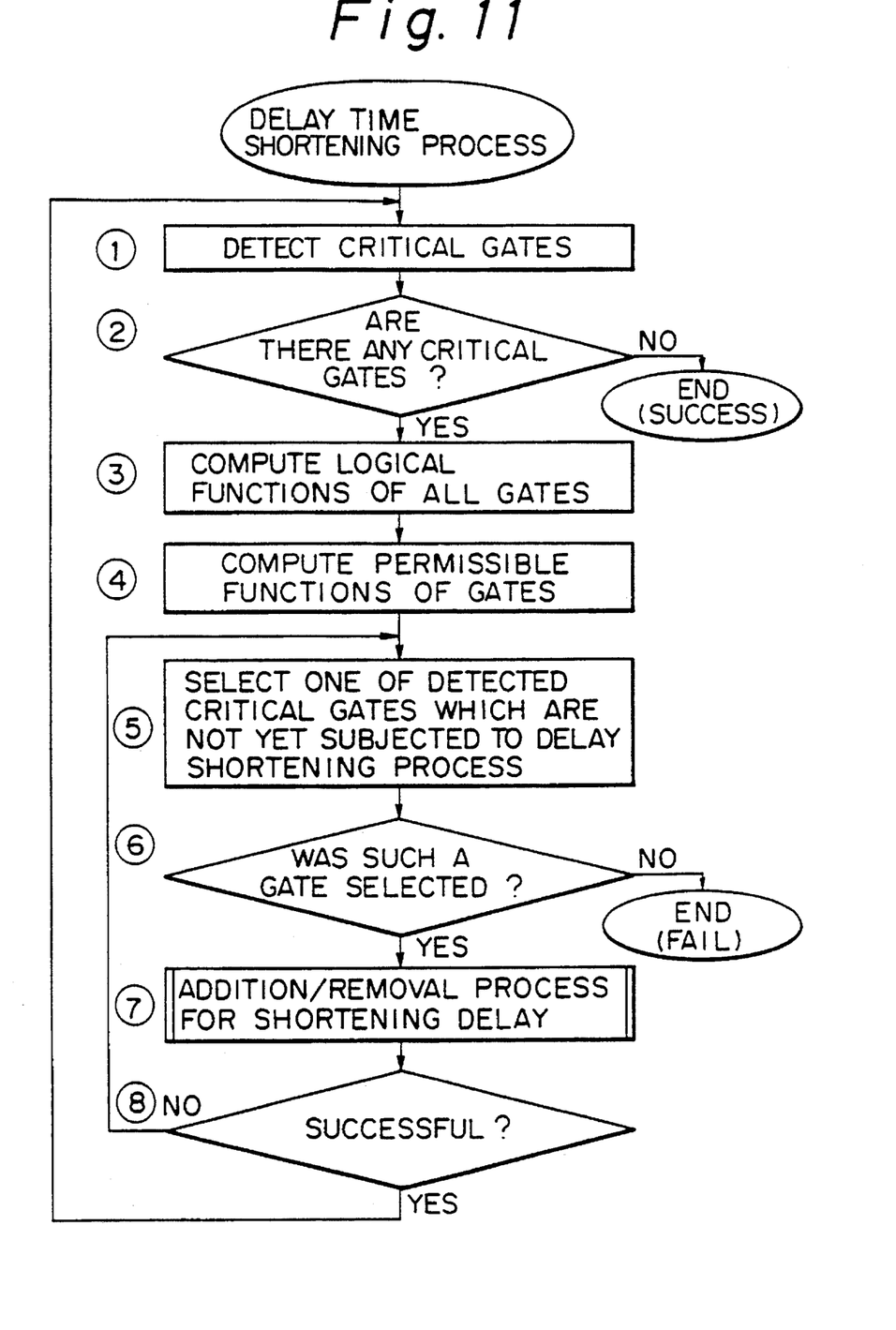
FIGS. 11, 12(A) and 12(B) are flowcharts showing flows of a delay time shortening process according to the embodiment.

FIGS. 6 to 12 show an embodiment of the invention, in which FIG. 6 shows a process of computing permissible functions, FIG. 7 is an example of computation of a permissible function of an input of a gate, FIG. 8 is an example of a gate whose output is connected to only one gate, FIG. 9 is an example of computation of a permissible function of a gate whose output is connected to a plurality of gates, FIG. 10 is an example of circuit conversion based on permissible functions, and FIGS. 11 and 12 are flowcharts showing a delay time shortening process.

The process of computing permissible functions according to the embodiment of the invention will be explained with reference to the flowchart of FIG. 6 and a circuit diagram of FIG. 13.

Figure 13:
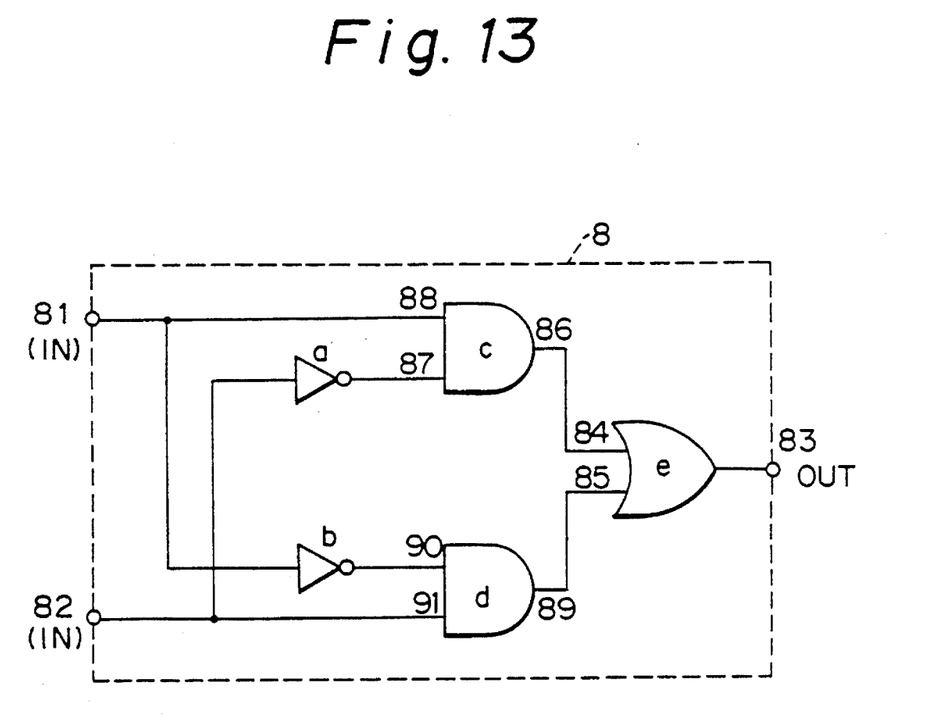
FIG. 13 is a diagram showing an example of an integrated circuit.

Step 1 of FIG. 6 computes a permissible function of an output of a circuit 8 of FIG. 13, and permissible functions of gates sequentially. Here, the permissible functions of the circuit are sequentially computed from the output side toward the input side of the circuit. In this way, a permissible function of an output (OUT) 83 of gate e is computed.

Step 2 of FIG. 6 selects one of gates whose permissible functions have already been computed. In this example, the gate e is selected because the permissible function of the output (OUT) 83 of the gate e has been computed in the step 1.

Step 3 of FIG. 6 computes permissible functions of all inputs of the selected gate e. Namely, the step 3 computes permissible functions of inputs 84 and 85 of the selected gate e, respectively.

Step 4 of FIG. 6 computes, if possible, a permissible function of each input gate of the selected gate e. In this example, gate e has two input gates c and d, and step 4 computes the permissible function of each of the gates c and d. They may simultaneously be computed.

When input 84 of the gate e is connected to an output 86 of the gate c through a single line, the permissible function of input 84 of the gate e is equal to that of the output 86 of gate c, so that the permissible function is computable and judged to have been already computed. If the output 86 of the gate c is branched or connected to another gate, the permissible function of the output 86 of gate c cannot be computed until the permissible function of an input of the other gate to which the output of the gate c is branched is found.

In computing the permissible function of a gate, for example of gate c, the permissible functions of all gates to which the output 86 of the gate c is connected must be computed in advance.

The permissible function of the output 86 of the gate c of FIG. 13 is equal to the permissible function of the input 84 of the gate e. A similar computation is done on the gate d and gates located on the downstream side.

Step 5 of FIG. 6 judges or determines whether or not the permissible functions of all the gates have been computed. If the result of the judgment is affirmative, the permissible function computing program ends.

If the permissible function of an output of any one gate is not computable, this gate is skipped, and the permissible function of another gate is computed curing this flow blockage of the process, the permissible function of the skipped gate then becomes computable.

The above process is repeated until the permissible functions of all the gates are completely computed, and when all are computed, the permissible function computing process ends.

Next, the details of the computation of the permissible function will be explained.

The present invention employs a vector expression of [x,y,z,w] to indicate logic. Each of elements x,y,z and w of the vector expression corresponds to a logical value of a combination of inputs. Namely, an input circuit is expressed with a vector of $2^n$ elements. For example, a two-input AND gate provides a logic of [0,0,0,1], and a two-input XOR gate provides a logic of [0,1,1,0].

An example of computation of a permissible function of an input of a gate G4 of FIG. 7 will now be explained.

The gate G4 has an input a of logic [0,1,1,0], another input b of logic [0,1,1,1], and an output c of permissible logic [0,*,1,0]. A permissible function of the input a is to be found.

Computation of each element of the vector of the permissible function will be as follows:

First Element

The permissible function element of the output c is 0, and the logic of the input b is 0, so that the logic of the output c is 0 irrespective of a value of the input a. Namely, a value of the input a is not transferred to the output c. As a result, the permissible function element of the input a is *. Here, the mark "*" denotes "don't care" which may be either 0 or 1.

Second Element

The permissible function element of the output c is *, so that the value of the input a is not transferred to the output c. As a result, the permissible function element of the input a is *.

Third Element

The permissible function element of the output c is 1, and that of the input b is 1. As a result, the input a must be 1 to transfer 1 to the output c.

Fourth Element

The permissible function element of the output c is 0, and that of the input b is 1. As a result, the input a must be 0 to transfer 0 to the output c.

In this way, the permissible function of the input a becomes [*,*,1,0].

Thereafter, the permissible function of a gate is connected to the gate whose permissible function has just been computed, i.e., gate a.

In FIG. 8, a gate G5 is connected only to a gate G6, so that the permissible function of the gate G5 is equal to that of an input c of the gate G6.

In FIG. 9, an output of a gate G7 is connected to two gates G8 and G9, so that a permissible function of the gate G7 is determined by the permissible functions of the two gates. An input d of the gate G8 has a permissible function of [1,0,*,*] and an input e of the gate G9 has a permissible function of [1,*,*,0], so that the permissible function of the gate G7 will be [1,0,*,0].

In this way, the invention computes the respective permissible functions of the gates.

When the respective permissible functions of the gates to be arranged are computed, the invention performs the second process P2 to shorten a delay time.

FIGS. 10(A) to 10(D) show a model of a circuit in which gates are added or removed according to the delay time shortening process (the second process P2) of the invention.

In FIG. 10(A), an AND gate h of a circuit 9 has a logic function of [0,0,0,0,1,0,0,1], and a permissible function of [0,0,0,*,*,0,0,1] as shown in FIG. 10(B). The reason why the gate h has this permissible function is because another circuit is connected to an output of the gate h to determine such a permissible function.

When the input b is added to the gate h, the logic of the gate h becomes [0,0,0,0,0,0,0,1] which is included in the permissible function, so that the addition of the input b may not change the function of the circuit.

Thereafter, inputs to the gate h are removed. First, an output of a gate d is removed from the gate h. Then, the logic of the gate h becomes [0,0,0,1,0,0,0,1] which is included in the permissible function, so that the function of the circuit will not change. Similarly, an output of a gate g is removed.

As a result, the circuit 9 of FIG. 10(A) can be changed to a circuit of FIG. 10(C). Further, a new input c can be added to the gate h because it does not change the logic of the gate h. With the addition of the input c, an output of a gate f can be removed.

In this way, a final circuit configuration of FIG. 10(D) is prepared. As is apparent in the figure, paths from the inputs b and c to the gate h are shortened. The shortening of the paths between the gates can reduce the overall size of the circuit and the delay time of the circuit.

The present invention develops this idea in replacing a gate having a long delay time with a gate having a short delay time or removing the gate having the long delay time in a circuit, without changing the permissible function of the circuit.

An overall flow of the delay time shortening process will now be explained with reference to FIGS. 11 and 12(A) and 12(B).

FIG. 11 is a flowchart showing a basic operation of the second process P2 of the invention.

Step 1 detects critical gates violating a prescribed delay time given to a circuit involving the gates. If there is no critical gate in step 2, the process ends. If there are any critical gates, step 3 computes logic functions of all gates of the circuit according to the first process P1 explained before. Thereafter, step 4 computes permissible functions of all the gates. Step 5 selects one of the detected critical gates which have not been subjected to the delay shortening process. If step 5 detects no gates in step 6, the process ends. If there are detected critical gates which have not been subjected to the delay shortening process, step 7 initiates the addition/removal process for shortening delay. If the addition/removal process is successful by shortening the delay within the prescribed delay time, step 8 then begins the delay time adjusting process again in step 1 for detecting a different critical gate violating a prescribed delay time. If the addition/removal process is unsuccessful, step 5 is initiated which selects a different detected critical gate which has not been subjected to the delay shortening process.

A gate addition/removal process of the invention for shortening a delay time will be explained with reference to FIG. 12(A) and 12(B).

Step 12 judges whether or not a gate having a shorter signal propagation time than the maximum delay time of the critical gate can be added to a gate to which the critical gate is connected. In this case, the permissible function of the gate to be added must be included in the permissible function of the critical gate.

If step 12 judges or determines that there is a gate to be added, step 13 computes a permissible function realized when the gate is added to the gate to which the critical gate is connected.

Step 14 judges whether or not the permissible function of the gate to be added is included in the permissible function of the critical gate. If it is included, step 15 adds the gate to the gate to which the critical gate is connected. If it is possible to add a plurality of gates, all of them may be simultaneously added.

If there is no gate to be added in step 12, step 16 judges that the addition has failed, and the flow returns to step 12.

Figure 12A:
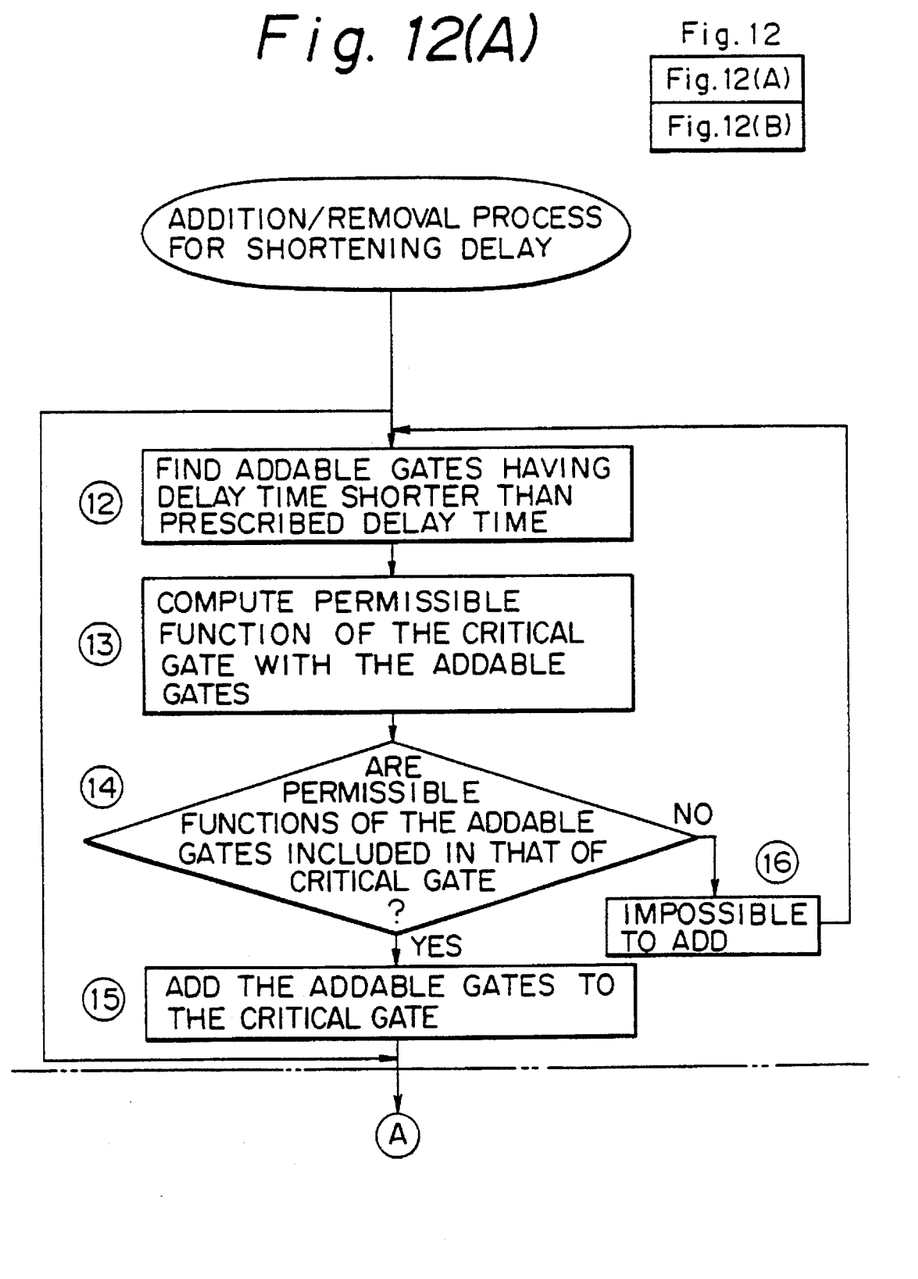
Figure 12B:
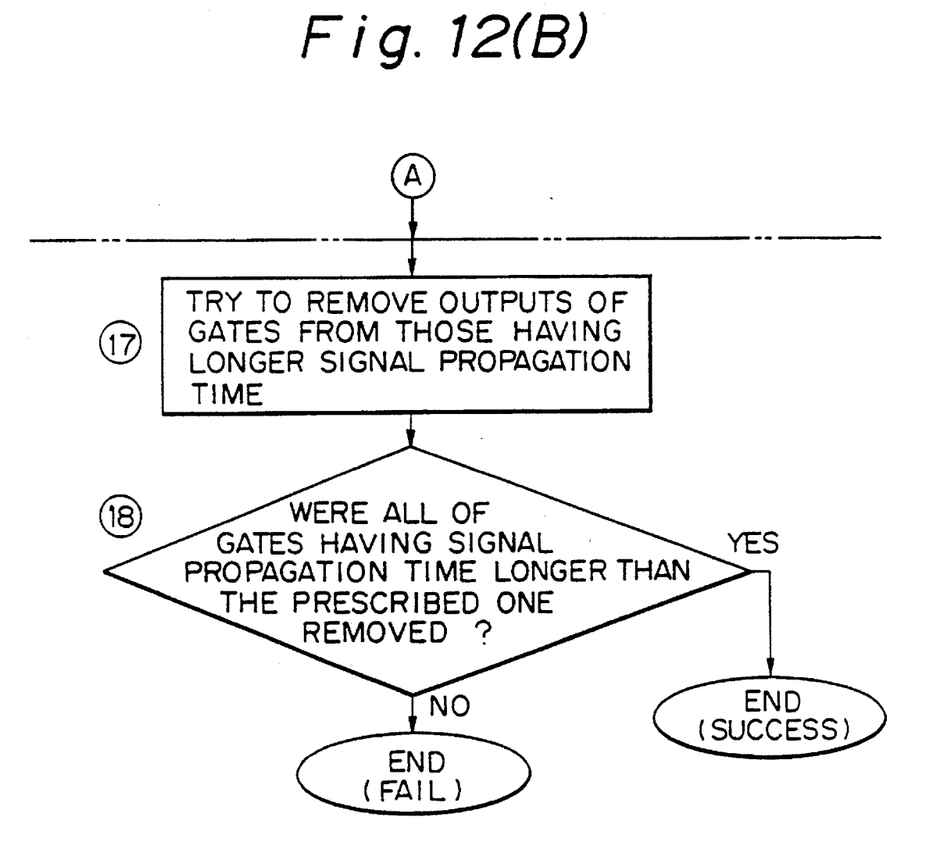

After the gate(s) is added in the step 15, step 17 of FIGS. 12(B) tries to remove a gate having a long signal propagation time. Since the step 15 adds the new gate(s) to the gate to which the critical gate is connected, the number of inputs of the gate increases, so that the step 17 tries to successively remove the inputs having a long signal propagation time. Gates are added as much as possible, and the gates that are removable are successively removed from among those having a longer signal propagation time.

Step 18 judges whether or not the gates having a signal propagation time longer than the prescribed delay time have all been removed from the circuit. If the result is YES, no gates having a signal propagation time longer than the prescribed delay time exist in the circuit, and it is judged that the circuit has successively been changed. This completes the second process P2.

If result of the step 18 is NO, it is judged that the process of totally removing the gates having a signal propagation time longer than the prescribed delay time has failed, and the second process is completed.

In the second process of the invention, other gates may not necessarily be added to the critical gate but only the critical gate may be removed to shorten the signal propagation time below the prescribed delay time.

For this reason, in FIG. 12(A), the flow may directly advance from step 11 to the step 17 of FIG. 12(B), and step 17 judges whether or not the critical gate is removable. In this case also, the permissible function of the critical gate is compared with a permissible function realized after the removal of the critical gate. If the permissible function after the removal is included in the permissible function before the removal, it is judged that the critical gate can be removed. Thereafter, step 18 carries out the above-mentioned judgement to complete the process.

As explained above, the present invention entirely changes a circuit to shorten the maximum delay time of the circuit without using conversion patterns. Since the invention converts the circuit not into logical expressions but directly into another configuration with actually used gates, it is possible to precisely adjust the circuit with the characteristics of the gates being taken into account.

I claim:

1. A method of automatically designing an LSI combinational circuit using a computer, comprising:

(a) computing a permissible function of output gates in an initial circuit;

(b) selecting one of the output gates whose permissible functions have been computed in step (a);

(c) computing permissible functions of all inputs of the output gate selected in step (b);

(d) computing a permissible function of each input gate of the output gate selected in the step (b);

(e) computing permissible functions of the remaining gates in the initial circuit;

(f) computing path delay of circuit paths of the initial circuit;

(g) selecting a path gate located on a circuit path that does not satisfy a prescribed delay time;

(h) performing one of:
      (1) deleting the selected path gate; and
      (2) adding an additional path gate and deleting the selected path gate to change an arrangement of the initial circuit to satisfy the prescribed delay time.

2. A method of automatically designing an LSI combinational circuit using a computer comprising:

(a) computing a permissible function for each gate of an initial circuit;

(b) computing path delay of circuit paths of the initial circuit;

(c) selecting a path gate located on a circuit path that does not satisfy a prescribed delay time;

(d) detecting gates in the initial circuit whose signal propagation time is longer than a prescribed delay time;

(e) selecting as a target gate one of the gates detected in step (d) located closer to an output of the initial circuit; and (f) performing a delay time shortening process by performing one of:

(i) deleting the target gate; and (ii) adding another gate and deleting the target gate and the permissible function of the target gate is maintained, thereby shortening a signal propagation time.

3. A method as set forth in claim 2, wherein the delay time shortening process comprises:

(1) computing a prescribed and desired delay time of a first gate having a first signal propagation time that must be shortened;

(2) selecting a second gate having a second signal propagation time shorter than the first signal propagation time of the first gate and which can transmit a signal in a shorter time than the prescribed and desired delay time;

(3) computing a permissible function of the second gate selected;

(4) adding the second gate to the first gate, if the permissible function of the second gate is included in the permissible function of the first gate; and (5) deleting at least one of gates, the deleting including deleting the first gate having the first signal propagation time that is longer than the second signal propagation time of the second gate.

4. A method as set forth in claim 2, wherein the delay time shortening process comprises:

(1) comparing a signal transmission delay time of a first gate in the initial circuit with a prescribed delay time that must be met by the first gate;

(2) computing a remaining permissible function of remaining gates which will be remaining after deleting the first gate when the transmission delay time of the first gate is longer than the prescribed delay time; and (3) deleting the first gate when the remaining permissible function computed in step (2) is equivalent to the permissible function of the first gate.

* * * * *

UNITED STATES PATENT AND TRADEMARK OFFICE
CERTIFICATE OF CORRECTION

PATENT NO. : 5,490,268
DATED : FEBRUARY 6, 1996
INVENTOR(S) : Yusuke MATSUNAGA

It is certified that error appears in the above-indentified patent and that said Letters Patent is hereby corrected as shown below:

TITLE PAGE, Col. 2, OTHER PUBLICATIONS,
        line 7, ""the Transduction" should be
        --The Transduction--.

Col. 1,  line 14, "and" should be --and,--;
       line 32, "FIG." should be --FIGS.--; and
       line 32, "explains" should be --explain--;
       line 45, "list of" should be --list 7 of--;
       line 53, "the multistage" should be --of the multistage--;
       line 64, "FIG." should be --FIGS.--; and
       line 64, "2(B)" should be --2(B),--.

Col. 2,  line 9, "of conversion" should be --of or numbers of different conversion--.

Signed and Sealed this

Sixteenth Day of July, 1996

Attest:

BRUCE LEHMAN

Attesting Officer         Commissioner of Patents and Trademarks